United States Patent
Zinke

[19]

[11] Patent Number: 6,029,620
[45] Date of Patent: Feb. 29, 2000

[54] THERMOELECTRIC ENGINE BLOCK

[76] Inventor: Robert Dan Zinke, 7007 Metro Pkwy., Sterling Heights, Mich. 48311

[21] Appl. No.: 09/124,633

[22] Filed: Jul. 29, 1998

[51] Int. Cl.[7] ............................. F02F 7/00; H01L 35/30
[52] U.S. Cl. ............................. 123/195 R; 123/193.1; 123/193.2; 136/205; 136/225; 136/227
[58] Field of Search ............................. 123/193.1, 193.2, 123/195 R; 310/306, 307; 136/208, 217, 225, 227, 205

[56] References Cited

U.S. PATENT DOCUMENTS

| | | | |
|---|---|---|---|
| 1,618,744 | 2/1927 | Adams | 136/208 |
| 2,362,259 | 11/1944 | Findley | 310/306 |
| 4,653,443 | 3/1987 | Fukazawa et al. | 123/145 A |
| 5,726,380 | 3/1998 | Ozutsumi et al. | 136/208 |
| 5,793,119 | 8/1998 | Zinke | 290/2 |
| 5,837,928 | 11/1998 | Zinke | 136/208 |

*Primary Examiner*—Willis R. Wolfe
*Assistant Examiner*—Brian J Hairston
*Attorney, Agent, or Firm*—John R. Benefiel

[57] ABSTRACT

An engine block containing thermoelectric materials that generates a direct current during operation and, in so doing, provides for at least some of the necessary engine cooling requirements and for at least some of the electric power requirements. The result is wasted heat energy is being converted into electricity.

2 Claims, 2 Drawing Sheets

THERMOELECTRIC ENGINE BLOCK

BACKGROUND OF THE INVENTION

1. Field of the Invention

In one aspect this invention relates to electrical power generating systems for use in land vehicles having a prime mover. In a further aspect this invention relates to a method of cooling those prime movers.

2. Prior Art

Electric power is required for the operation of vehicles powered by internal combustion engines. With automotive engines, electricity is required for charging the battery, energizing the starter, and firing the spark plugs as well as powering the lights mounted on the vehicle itself To provide this electric power, present technology uses generators or alternators. To operate these devices, mechanical power must be diverted from the engine, decreasing available shaft horsepower. This extra work being done by the engine requires the consumption of extra fuel, thereby decreasing the overall fuel efficiency of the vehicle.

Internal combustion engines do not operate at 100% efficiency and a lot of energy is wasted in the form of heat loss. To prevent the engine from getting too hot, a method of rejecting this extra heat to the ambient environment must be provided and this is normally done by means of a radiator.

Thermoelectric modules convert electricity into a temperature differential between the two plates on each side of the module. It can also be demonstrated that such modules are able to produce electricity when the two plates on each side of the module are at different temperatures. Thermocouples develop an electrical potential proportional to the temperature differential between the junction of two dissimilar metal wires and their free ends. As with a thermoelectric module, a thermopile can be constructed of thermocouple-type materials and be used to produce electricity if a source of hot (or cold) temperature is available.

It would be desirable to use the waste heat produced by automotive engines to generate electricity. If this could be done, generator/alternators could be eliminated or, at least, reduced in size and duty cycle requirements.

SUMMARY OF THE INVENTION

The present invention provides this technology. This invention is to manufacture internal combustion engines, or any other type of engine that produces or uses heat, out of thermocouple-type materials. Alternately, another application of this technology would be to attach thermoelectric modules to the exterior of an engine, which would minimize redesign of internal engine components. Either way, fuel being wasted due to the generation of heat in the engine, being wasted by pumping coolant, and being wasted by the generation of electricity by means of a mechanically driven alternator or generator would be decreased. Any electric power derived from wasted engine heat would decrease the electricity demand placed on the alternator/generator. It may be necessary to electrically isolate the block from the grounded frame, however.

BRIEF DESCRIPTION OF THE DRAWINGS

DETAIL A is an enlarged sectional view of one corner of the engine block depicted in FIG. 1.

DETAILED DESCRIPTION OF THE INVENTION

Figure 1:
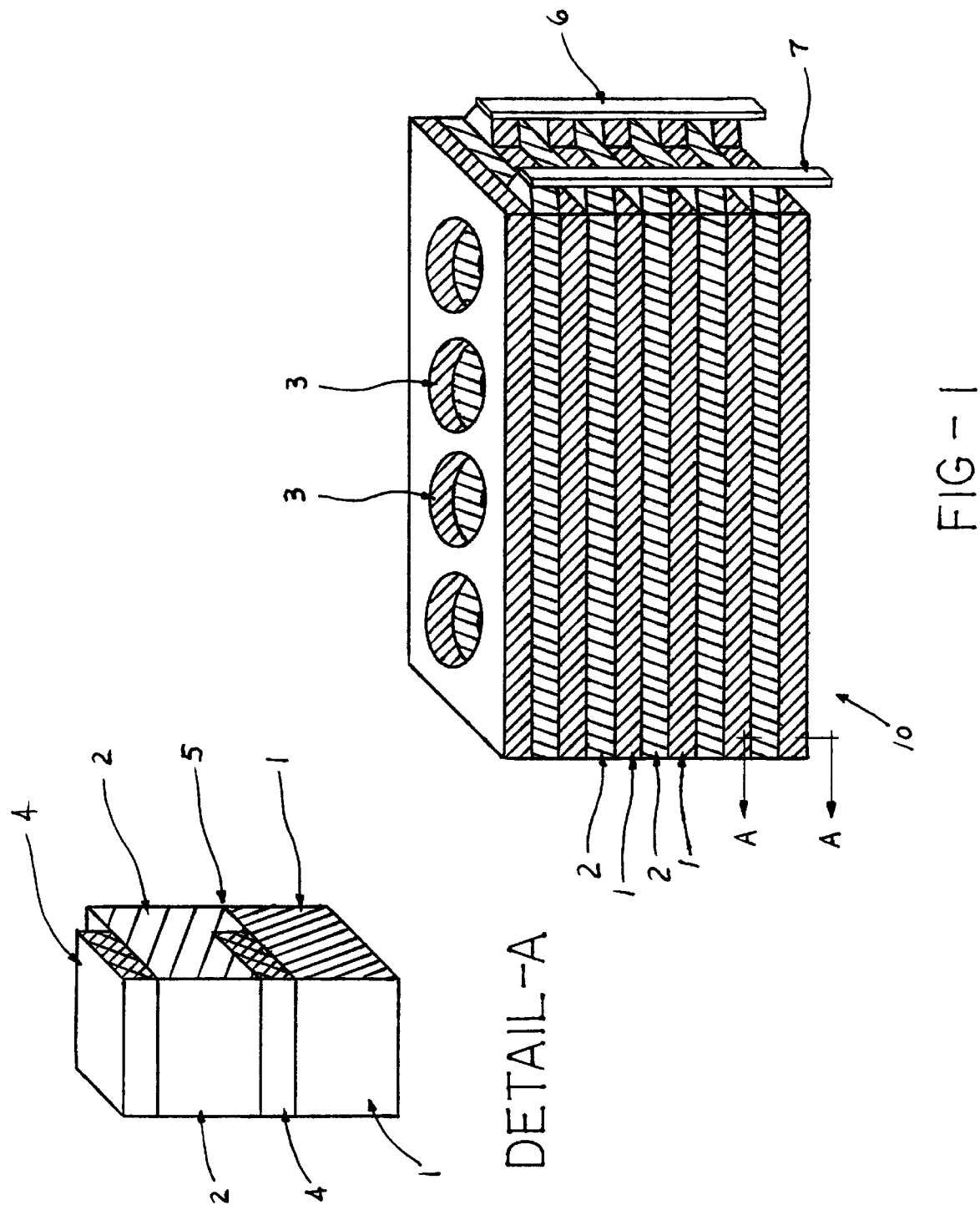
FIG. 1 is an isometric view of one embodiment of this invention in which the engine block has been fabricated by assembling thermoelectric materials.

Referring to the accompanying in which like numerals refer to like parts and initially to FIG. 1, the improved engine block 10 of this invention for use in powered vehicles (not shown). It is common for such engine blocks to be the prime mover for said vehicles. Such engine blocks require cooling which is achieved by discharging unusable heat to a neighboring medium, such as air or water. Extra fuel is thereby consumed and lost as waste heat. This cooling is often done by means of a closed loop recirculating liquid coolant system. The closed loop system has a pump for circulating liquid coolant within the closed loop system, which also consumes power. Such cooling systems are known in the art of land vehicle design and a detailed description is omitted in the interest of brevity. Depending on the engine block materials, efficiency of thermoelectric generation, state of battery electrical charge, how many vehicular lights are illuminated, etc., some type of cooling system in addition to thermoelectric generation will probably still be required for such an improved engine block.

The improved engine block shown in FIG. 1 is assembled by attaching two types of plates, 1 and 2. These two types of plates are different because of the material they're made of. The plates are arranged in an alternating pattern so that no two plates of the same material are ever touching inside the engine block. The plates of each material therefore form a spaced lamella. The two lamella are interleaved through each other, forming a solid engine block during assembly. The two materials are selected for their capability to generate an electric potential when heat is applied to their junction(s), as occurs with a thermocouple. For example, if one material is iron, the other material could be constantan. The junctions of these dissimilar plates are inside the engine block, where heat is generated during the internal combustion process (or resident due to an external combustion process) in the cylinders 3. The plates may be separated by thermally and electrically insulating material 4, except for at the plate junctions 5. Examples of thermally and electrically insulating materials are bakelite, rubber, fiberglass insulation, or simply an air gap, with the latter being preferred for an air-cooled engine 10 application. Plate junctions 5 can be formed by any process that yields an electrically conductive, heat resistant junction, such as eutectic soldering. Plates of similar materials are connected together by means of electrically conductive buses 6, 7, which are shown here mounted externally. The two buses 6, 7 are used to deliver the electrical power to one or more electricity consuming devices/loads (not shown). Plates 1 are connected to bus 6 while plates 2 are connected to bus 7. During engine operation, one plate will develop a positive electrical potential and the other plate will develop a negative electrical potential and this process will enable electrical current flow.

Figure 2:
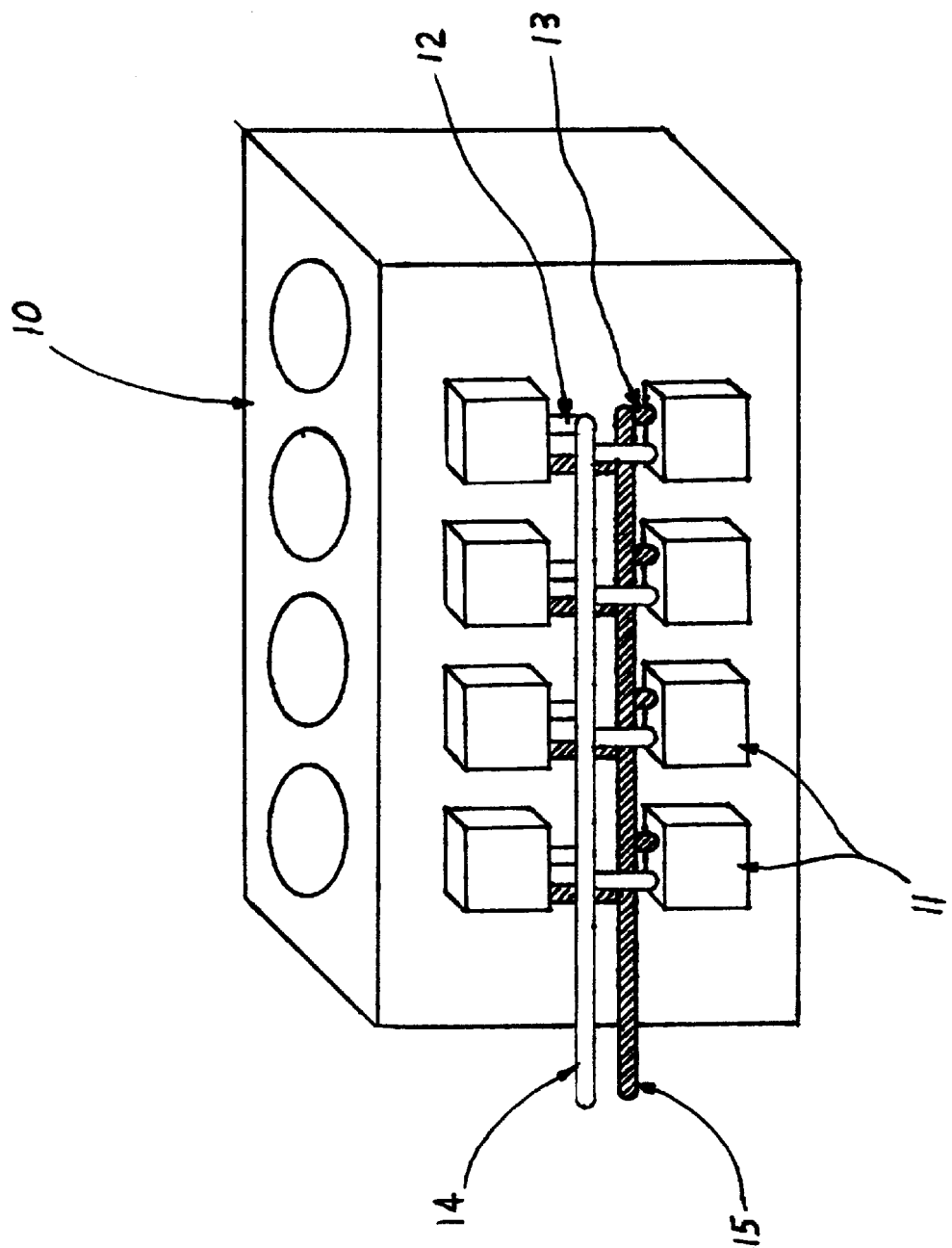
FIG. 2 is an isometric view of another embodiment of this invention in which the thermoelectric modules are mounted externally to an engine block of a current state of the art design.

The improved engine block shown in FIG. 2 is a standard engine block 10 that has been manufactured to existing state of the art specifications. Following assembly, however, thermoelectric modules 11 have been attached to the engine block. When the engine block 10 is in operation, heat is generated during the combustion process and the thermoelectric modules 11 are of such a nature that they produce electricity when one side has a higher temperature than the other. Each thermoelectric module 11 has a positive electrical lead 12 and a negative electrical lead 13. All the positive leads 12 are connected to the positive electrical bus 14 and all the negative leads 13 are attached to the negative electrical bus 15. Electrical buses 14 and 15 are used to draw electric power away from engine block 10. Additional thermoelectric modules may be mounted on other heated surfaces, e.g., exhaust pipe, radiator, air conditioner components, etc., of the vehicle for which the engine block is the prime mover so long as provision is made to have these additional modules connected to electrical buses 14 and 15 or some other electrical distribution system.

Various alterations and modifications will become apparent to those skilled in the art without departing from the scope and spirit of this invention and it is understood this invention is limited only by the following claims.

What is claimed is:

1. In a vehicle having a combustion engine including an engine block as a prime mover, and said vehicle also having electricity utilizing devices, a thermoelectric engine block structure suitable for converting a portion of the waste heat generated by said engine into useful direct current including: a first plurality of spaced lamella the lamella being formed of a first thermoelectric material; a second plurality of spaced lamella the second plurality of lamella being formed of a second thermoelectric material, the second plurality of lamella having interior surfaces interleaved with the first plurality of lamella to have electrical contact with each other at junctures therebetween; the first plurality of lamella and the second plurality of lamella receiving heat generated by said engine; a first electrical bus connecting the first lamella of thermoelectric material, said first bus being connected to the positive electrical portion of said vehicle electricity utilizing devices, and a second bus electrically connected to the negative portion of said vehicle electricity utilizing devices; whereby hot temperatures within the interior surfaces of the first and second lamella provide a current to said vehicle electricity utilizing devices, and said lamella also extract heat from said engine.

2. An improved combustion engine system including an engine block, said engine system comprising a prime mover for a vehicle having various electricity utilizing devices, wherein thermoelectric components are integrated into said engine block, and with said thermoelectric means for including means converting waste heat generated by said engine into useable electrical power and directing said power to said electricity utilizing devices while also performing an engine cooling function.

\* \* \* \* \*